(12) United States Patent
Lee et al.

(10) Patent No.: US 11,994,554 B2
(45) Date of Patent: May 28, 2024

(54) TEST APPARATUS FOR SEMICONDUCTOR PACKAGE

(71) Applicant: TSE CO., LTD., Chungcheongnam-do (KR)

(72) Inventors: Sol Lee, Chungcheongnam-do (KR); Min Cheol Kim, Chungcheongnam-do (KR)

(73) Assignee: TSE CO., LTD., Chungcheongnam-do (KR)

( * ) Notice: Subject to any disclaimer, the term of this patent is extended or adjusted under 35 U.S.C. 154(b) by 148 days.

(21) Appl. No.: 17/892,756

(22) Filed: Aug. 22, 2022

(65) Prior Publication Data

US 2023/0069125 A1 Mar. 2, 2023

(30) Foreign Application Priority Data

Aug. 27, 2021 (KR) .................. 10-2021-0114106
Dec. 27, 2021 (KR) .................. 10-2021-0188244

(51) Int. Cl.
*G01R 31/28* (2006.01)

(52) U.S. Cl.
CPC ..... *G01R 31/2889* (2013.01); *G01R 31/2863* (2013.01)

(58) Field of Classification Search
CPC .......... G01R 31/31924; G01R 31/2856; G01R 31/2875; G01R 31/2877
See application file for complete search history.

(56) References Cited

U.S. PATENT DOCUMENTS

| 2011/0199113 A1* | 8/2011 | Lee ............... G01R 31/2893 324/757.04 |
| 2011/0248737 A1* | 10/2011 | Takeshita ........ G01R 31/2889 324/756.02 |
| 2013/0224970 A1* | 8/2013 | Sandhu ........... H01R 12/57 439/68 |

FOREIGN PATENT DOCUMENTS

KR 10-2015-0106848 9/2015
KR 10-1555965 9/2015

* cited by examiner

*Primary Examiner* — Tung X Nguyen

(57) ABSTRACT

The present disclosure relates to a test apparatus for a package-on-package type semiconductor package including a lower test socket mounted on a tester, and connected to a lower package to electrically connect the lower package to the tester; a pusher configured to be able to be moved vertically by receiving a driving force from a driving unit; an upper test socket mounted on the pusher, and having an electro-conductive part installed below the upper package to be electrically connected to the upper package; a vacuum picker mounted on the upper test socket to be able to vacuum-adsorb the lower package; and an inelastic insulating sheet installed between the upper test socket and the upper package, having a through hole formed at a position thereof corresponding to the terminal of the upper package and the electro-conductive part.

20 Claims, 6 Drawing Sheets

< Prior Art >

TEST APPARATUS FOR SEMICONDUCTOR PACKAGE

CROSS-REFERENCE TO RELATED APPLICATION

This application claims priority of Korean Patent Application No. 10-2021-0114106, filed on Aug. 27, 2021, and priority of Korean Patent Application No. 10-2021-0188244, filed on Dec. 27, 2021, in the KIPO (Korean Intellectual Property Office), the disclosure of which is incorporated herein entirely by reference.

BACKGROUND OF THE INVENTION

Field of the Invention

The present disclosure relates to a test apparatus for a semiconductor package, and more particularly, to a test apparatus for a semiconductor package for testing whether a package-on-package (POP) type semiconductor package, in which a lower package and an upper package are vertically stacked, is normally operated.

Description of the Related Art

In general, a semiconductor package is formed by integrating fine electronic circuits with high density, and during a manufacturing process, is subjected to a test process for determining whether each electronic circuit is normal. The test process is a process for testing whether a semiconductor package is normally operated, and, as a result, distinguishing defect-free products from defective products.

In a process for testing a semiconductor package, a test apparatus which electrically connects a terminal of the semiconductor package and a tester applying a test signal is employed. The test apparatus has various structures depending on a type of the semiconductor package to be tested.

Recently, as use of a package-on-package (POP) type semiconductor package which minimizes component size and enables signal to be rapidly transmitted has been increased, demand for the test apparatus for testing such semiconductor package has also been steadily continuing.

The package-on-package type semiconductor package is manufactured by sequentially stacking one package on a package performing different function (stack type).

The package-on-package type semiconductor package is advantageous in that since a length of connecting wiring can be minimized, it is possible to minimize losses such as a signal delay and an impedance mismatch occurred during a two-dimensional arrangement, and in that, by utilizing a spatially vertical direction, a mounting area per unit area can be maximized to realize large-capacity and ultra-small sized part.

FIG. 1 is a view illustrating a conventional test apparatus for testing a package-on-package type semiconductor package, and FIG. 2 is a view illustrating an operation of the conventional test apparatus.

As shown in FIGS. 1 and 2, a conventional test apparatus 1 is comprised of a pusher 50 configured to be able to be moved vertically by receiving a driving force from a driving unit (DP) 90 and having a vacuum space (vacuum region) formed therein, an upper package 40 mounted on the pusher 50, a second test circuit board 20 on which the upper package 40 is mounted, an upper test socket 70 coupled to a lower portion of the second test circuit board 20, a vacuum picker 71 disposed below the upper test socket 70 so as to be able to vacuum-adsorb a lower package 10, and a lower test socket 60 seated on a first test circuit board (tester) 30 (herein, the first test circuit board is also referred to as a tester).

The pusher 50, the upper package 40 mounted in the pusher 50, the second test circuit board 20 on which the upper package 40 is mounted, the upper test socket 70 connected to the lower portion of the second test circuit board 20, and the vacuum picker 71 disposed below the upper test socket 70 constitute an upper test socket assembly TSA.

The upper package 40 is provided with a terminal 41 at a lower portion thereof, and is a package which is pre-selected as a defect-free product to serve as a so-called golden device which may be used to test whether the lower package 10 is normally operated. The lower package 10 may be a device to be tested having the lower terminal 11 and an upper terminal (not shown).

The upper test socket 70 and the lower test socket 60 are provided with a second electro-conductive part 73 and a first conductive part 61, respectively, and each electro-conductive part has a configuration in which a plurality of electro-conductive particles is aligned in an elastic insulating material in a thickness direction.

The lower test socket 60 is mounted on the first test circuit board (tester) 30, The lower package 10 is placed on an upper surface of the lower test socket 60 and the upper test socket 70 is connected to an upper surface of the lower package 10, so a test current applied from the tester 30 passes through the lower package 10 and is then applied to the upper package 40 through the second test circuit board 20 to perform an electrical test. In FIGS. 1 and 2, reference number 11 denotes a terminal, and reference number 80 denotes a guide housing.

In the conventional test apparatus 1, a vacuum pressure generated from a vacuum pressure generating device VG is transmitted to the vacuum picker 71 and the vacuum picker should adsorb the lower package 10 and pressurize it to the lower test socket 60. To this end, an inner space of the pusher 50 should be maintained in a vacuum state and a vacuum pressure line VL should be formed between the vacuum pressure generating device VG and the vacuum picker 71.

However, when the upper package 40 and the upper test socket 70 are directly connected to each other, in order to form an electrical path between the terminal 41 of the upper package and the second electro-conductive part 73 of the upper test socket, the terminal 41 of the upper package is coupled to the second electro-conductive part 73 of the upper test socket while compressing it. Accordingly, the sufficient vacuum pressure line VL is not formed between the upper package 40 and the upper test socket 70.

Therefore, in the conventional test apparatus 1, so as to form a vacuum pressure line between the upper package 40 and the upper test socket 70, the second test circuit board 20 is disposed between the upper package 40 and the upper test socket 70.

Since the upper package 40 is mounted on the second test circuit board 20 by soldering the terminal 41 of the upper package 40 to a terminal (not shown) of the second test circuit board 20, a space having a height corresponding to that of the terminal 41 of the upper package is formed between a lower surface of the upper package 40 and the second test circuit board 20, and this space serves as the vacuum pressure line through which a vacuum pressure generated from the vacuum pressure generating device VG is transmitted to the vacuum picker 71.

FIG. 2 illustrates the vacuum pressure line VL (that is a space between the upper package 40 and the second test circuit board 20) through which a vacuum pressure generated from the vacuum pressure generating device VG is transmitted to the vacuum picker 71.

A vacuum pressure generated from the vacuum pressure generating device VG flows through a hole 21 formed in a center of the upper test socket 70 and the second test circuit board 20 and then enters the space the upper package 40 and the second test circuit board 20. Thereafter, a vacuum pressure flows towards the vacuum pressure generating device VG (disposed outside the pusher 50) through a space between an inner wall of the pusher 50 and the upper package 40.

However, the conventional test apparatus 1 has the following problems: In order to secure the vacuum pressure line VL, the second test circuit board 20 on which the upper package 40 is mounted should be provided. A soldering process is not performed properly due to the influence of moisture, etc. existing between a terminal (not shown) of the second test circuit board 20 and the terminal 41 of the upper package 40, so a solder defect problem may occur. In addition, even though the soldering process is performed, solders are not uniformly formed, so that problems, such as a deviation in thickness between the terminals 41 of the upper package 40, cracks formed in the terminals 41 of the upper package 40, and the like occur.

In addition, a process of fabricating the second test circuit board 20 and a process of stacking the second test circuit board 20 on the upper package 40 are required. It takes a lot of time to fabricate this structure manufacture. Furthermore, due to the installation of the second test circuit board 20, the total weight is increased, so there is a problem that defects such as cracks in the solder ball terminal, and the like are caused. Due to these defects, an additional test for solder ball terminals of the package is required, so there is a problem in that the overall process is increased, thereby increasing the cost.

Furthermore, a length of the signal path between the upper package 40 and the lower package 10 is lengthened due to the installation of the second test circuit board 20. Due to this configuration, a signal delay and a signal distortion occur, and as a result, a problem is caused in that it is impossible to accurately test a semiconductor package operated at a high speed.

SUMMARY OF THE INVENTION

The present disclosure is invented to solve the above-mentioned problems, an object of the present disclosure is to provide a package-on-package type test apparatus for a semiconductor package, in which by changing a structure such that a vacuum pressure line is secured even if a second test circuit board is removed, a length of signal path is reduced to enable a precise test for a semiconductor package which is operated operate at high speed, and the electrical property test can be efficiently performed to significantly reduce a test cost and a test time.

In order to achieve the above object, a test apparatus for a semiconductor package according to the present disclosure may include a lower test socket mounted on a tester providing a test signal, and connected to a lower terminal of a lower package to electrically connect the lower package to the tester; a pusher configured to be able to be moved vertically by receiving a driving force from a driving unit; an upper test socket mounted on the pusher, and having an electro-conductive part installed below the upper package to be electrically connected to a lower terminal of the upper package; a vacuum picker mounted on a center of the upper test socket to be able to vacuum-adsorb the lower package; and an inelastic insulating sheet installed between the upper test socket and the upper package, the inelastic insulating sheet having a through hole formed at a position thereof corresponding to the terminal of the upper package and the electro-conductive part, and having a vacuum space part formed in a lower surface thereof corresponding to the upper test socket.

In addition, the vacuum space part of the inelastic insulating sheet may be formed to have a shape of concaved and elongated groove.

Also, the vacuum space part may have a plurality of deformation-preventing pillars formed therein and having a height for compensating for the concaved groove.

Furthermore, the inelastic insulating sheet may be formed from polyimide, FR4, engineering plastic or a metal on which an insulating plating layer is formed.

In addition, a vacuum pressure provided to the pusher may be applied to the vacuum picker through the vacuum space part.

Also, the upper test socket may be attached to the pusher in a vacuum-sealed manner with an adhesive.

Furthermore, the electro-conductive part of the upper test socket may be formed by arranging a plurality of electro-conductive particles in a thickness direction in an elastic insulating material.

In addition, the lower terminal of the upper package or the lower package may be configured as either a solder ball type or a land type.

Alternatively, a test apparatus for a semiconductor package according to the present disclosure may include a lower test socket mounted on a tester providing a test signal, and connected to a lower terminal of a lower package to electrically connect the lower package to the tester; a pusher configured to be able to be moved vertically by receiving a driving force from a driving unit; and an upper test socket mounted on the pusher, and having an electro-conductive part installed below the upper package that is a defect-free package, to be electrically connected to a lower terminal of the upper package, and is characterized in that the lower terminal of the upper package is formed in the form of a solder ball, and a plating layer of oxidation-preventing metal may be formed on an upper side of the lower terminal of the upper package which comes in direct contact with the electro-conductive part.

In addition, a nickel-plating layer may be formed between a surface of the lower terminal of the upper package and a plating layer of oxidation-preventing metal.

Here, the oxidation-preventing metal may be gold, palladium, rhodium, cobalt, or an alloyed metal of two or more thereof.

As described above, when the semiconductor package is tested, the test signal applied from the tester is applied to the lower test socket, the lower package, the upper test socket, and the upper package. In the test apparatus according to the present disclosure, the second test circuit board, which has been disposed in the conventional upper test socket assembly, is removed, and by installing the inelastic insulating sheet (which has the vacuum space) between the upper test socket and the upper package, the vacuum pressure line is secured in the upper test socket assembly, the vacuum pressure from the vacuum pressure generating device can be smoothly applied to the vacuum picker.

In addition, without using the conventional second test circuit board, it is possible to simultaneously check whether the lower package is in a normal state and whether the lower package is normally operated in a state where the lower package is coupled to the upper package. As a result, a length of the signal path between the upper package and the lower package is greatly reduced, so that signal delay and signal distortion can be prevented in high-speed signal transmission, and a semiconductor package which is operated at a high-speed can be precisely tested. Therefore, the test apparatus according to the present disclosure can efficiently perform the electrical property test for the semiconductor package, thereby significantly reducing the test cost and the test time.

Furthermore, since the test apparatus according to the present disclosure has the configuration in which the components constituting the upper test socket assembly are coupled to each other through an adhesive, it is easy to separate and combine the upper package, there is no loss of vacuum pressure by vacuum-sealing adhering portions, and the adhesive can mitigate impact that occurs when the lower package and the upper test socket assembly come into contact with each other.

Also, there is less risk of leakage of vacuum pressure between the pusher and the vacuum picker for adsorbing the lower package, and due to the configuration in which the vacuum pressure is stably transmitted from the vacuum pressure generating device to the vacuum picker, it is possible to reduce a pickup error when the lower package is picked up.

In addition, by forming a plating layer of oxidation-preventing metal on the lower terminal of the upper package constructed as a defect-free package, an increase in contact resistance between the electro-conductive part of the lower package and the lower terminal of the upper package is prevented even after repeated use, thereby improving the test reliability of the lower package.

BRIEF DESCRIPTION OF THE DRAWINGS

The above and other features and advantages will become more apparent to those of ordinary skill in the art by describing in detail exemplary embodiments with reference to the attached drawings, in which.

In the following description, the same or similar elements are labeled with the same or similar reference numbers.

DETAILED DESCRIPTION

Figure 1:
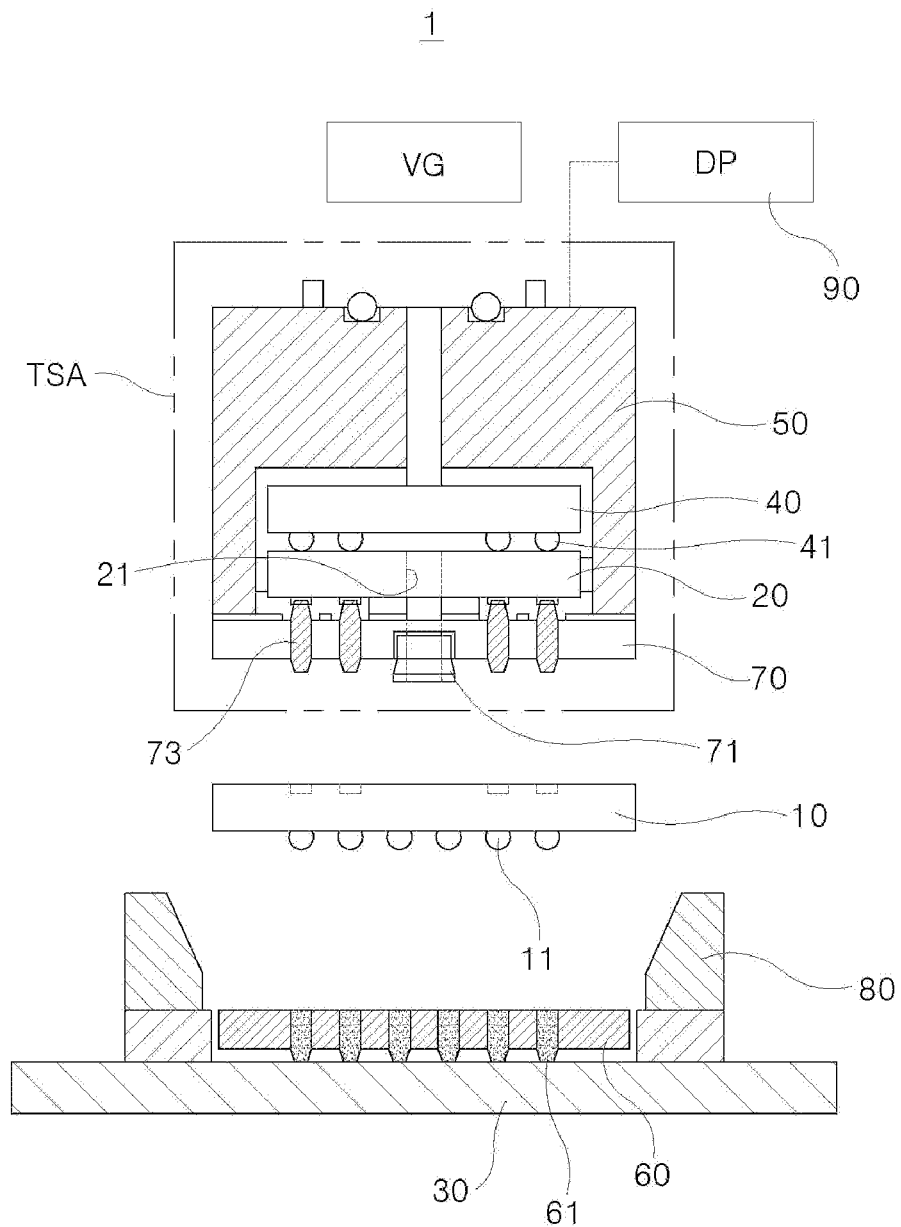
FIG. 1 is a view illustrating a conventional test apparatus for testing a package-on-package type semiconductor package.
Figure 2:
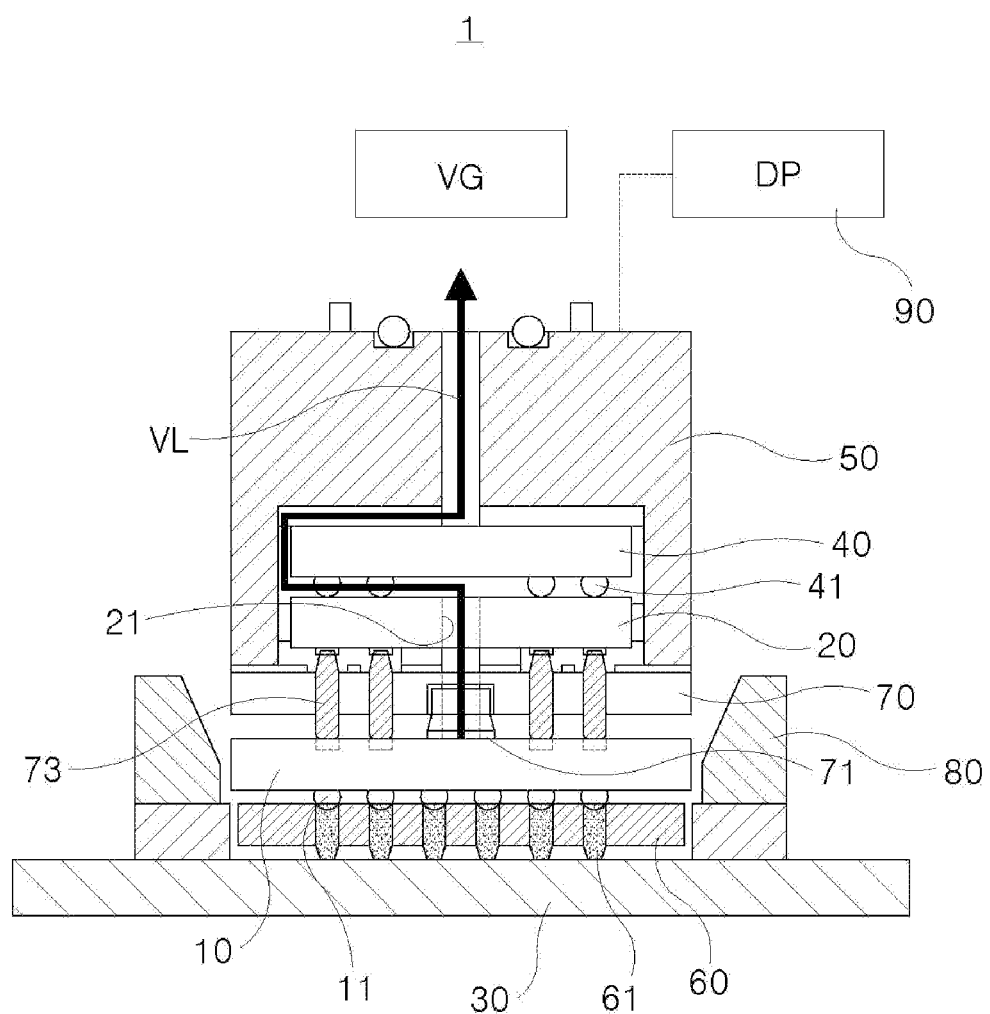
FIG. 2 is a view illustrating an operation of the conventional test apparatus.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "includes", "comprises" and/or "comprising," when used in this specification, specify the presence of stated features, integers, steps, operations, elements, and/or components, but do not preclude the presence or addition of one or more other features, integers, steps, operations, elements, components, and/or groups thereof. In addition, a term such as a "unit", a "module", a "block" or like, when used in the specification, represents a unit that processes at least one function or operation, and the unit or the like may be implemented by hardware or software or a combination of hardware and software.

Reference herein to a layer formed "on" a substrate or other layer refers to a layer formed directly on top of the substrate or other layer or to an intermediate layer or intermediate layers formed on the substrate or other layer. It will also be understood by those skilled in the art that structures or shapes that are "adjacent" to other structures or shapes may have portions that overlap or are disposed below the adjacent features.

In this specification, the relative terms, such as "below", "above", "upper", "lower", "horizontal", and "vertical", may be used to describe the relationship of one component, layer, or region to another component, layer, or region, as shown in the accompanying drawings. It is to be understood that these terms are intended to encompass not only the directions indicated in the figures, but also the other directions of the elements.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Preferred embodiments will now be described more fully hereinafter with reference to the accompanying drawings. However, they may be embodied in different forms and should not be construed as limited to the embodiments set forth herein. Rather, these embodiments are provided so that this disclosure will be thorough and complete, and will fully convey the scope of the disclosure to those skilled in the art.

Hereinafter, a test socket according to a preferred embodiment of the present disclosure, and a test apparatus including the same will be described in detail with reference to the accompanying drawings. At this time, it should be noted that in the accompanying drawings, the same components are denoted by the same reference numerals, if possible.

Figure 3:
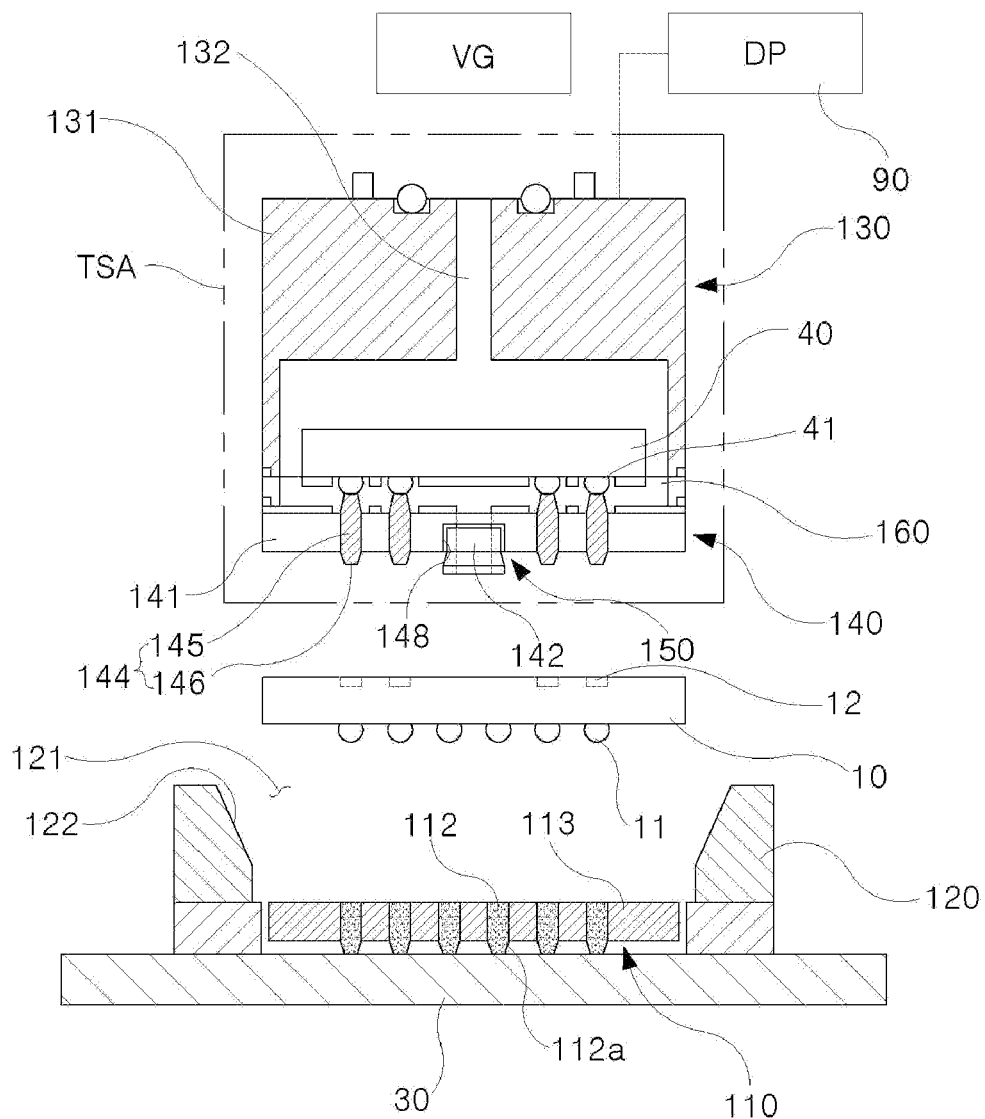
FIG. 3 is a view illustrating a test apparatus according to one embodiment of the present disclosure.
Figure 4:
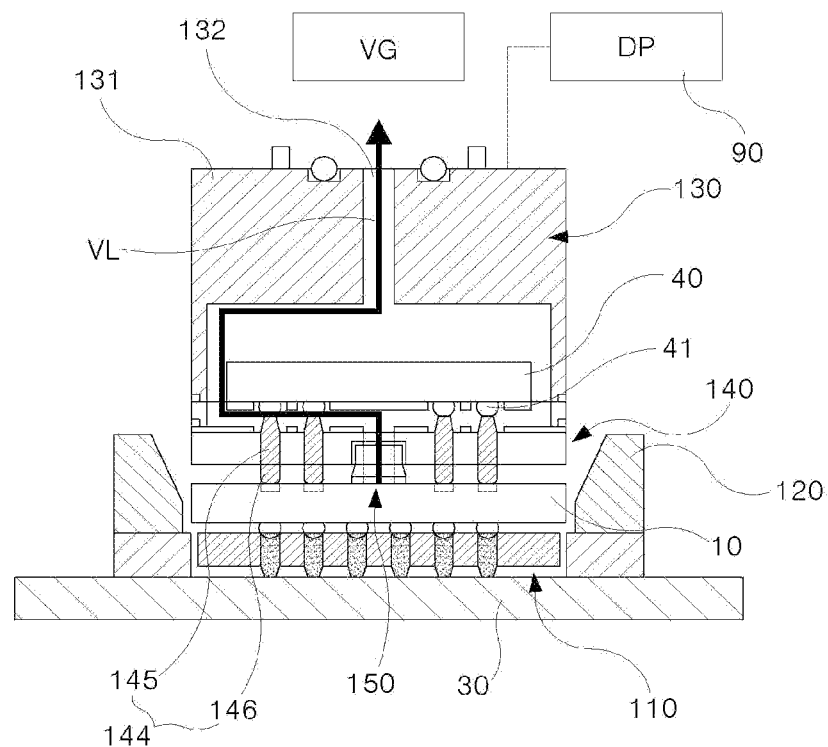
FIG. 4 is a view illustrating an operation of the test apparatus according to one embodiment of the present disclosure.
Figure 5:
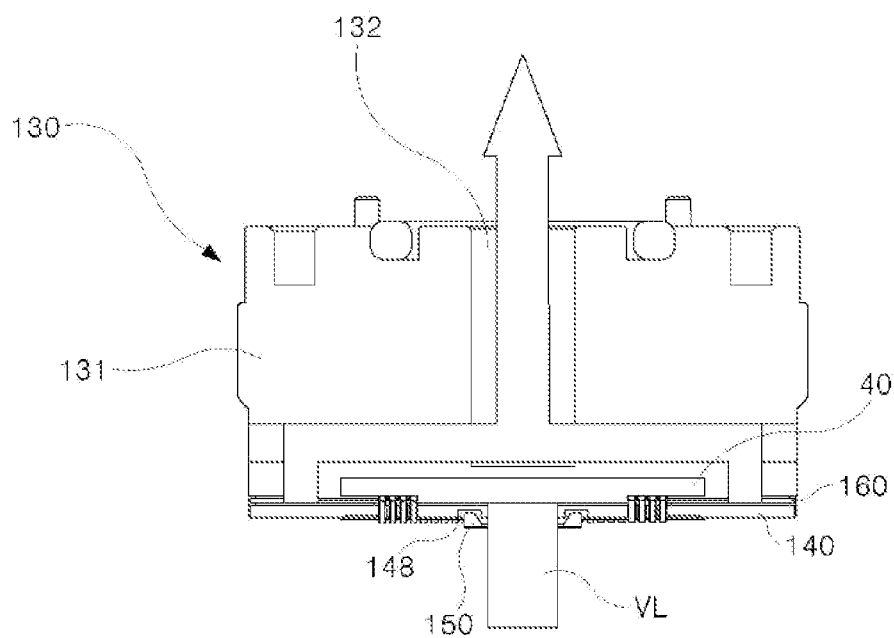
FIG. 5 is a front view illustrating an upper test socket assembly in the test apparatus according to one embodiment of the present disclosure.
Figure 6:
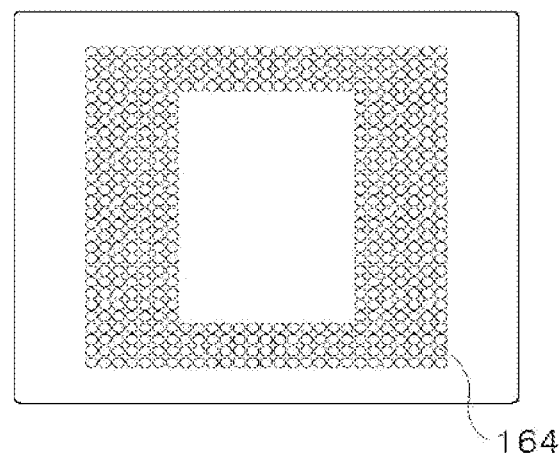
FIG. 6 is a top view illustrating an inelastic insulating sheet according to one embodiment of the present disclosure.
Figure 7:
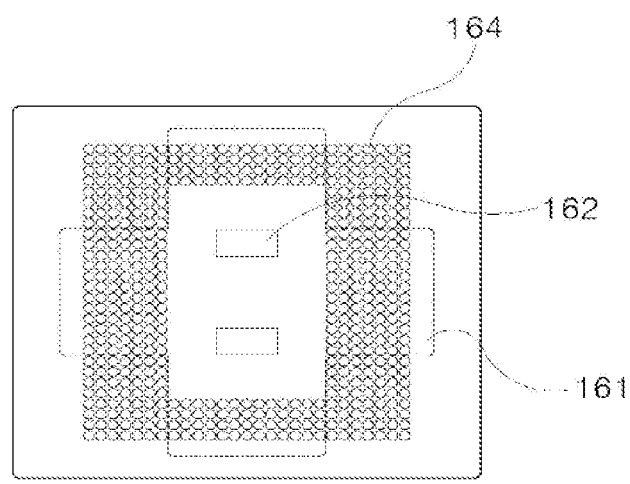
FIG. 7 is a bottom view of FIG. 6.
Figure 8:
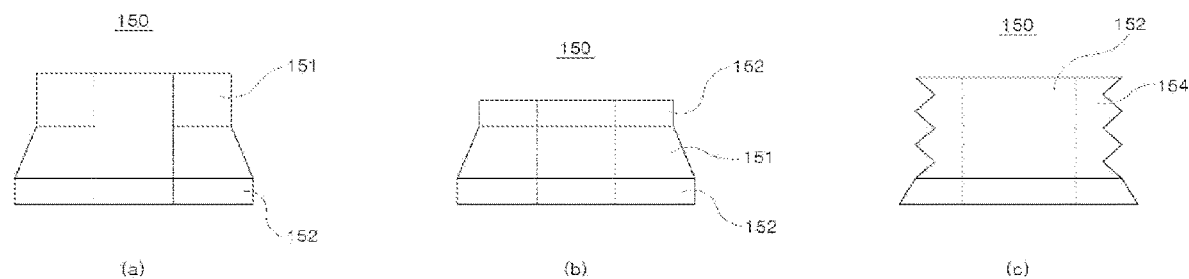
FIG. 8 is a side view illustrating a vacuum picker according to one embodiment of the present disclosure.

FIG. 3 is a view illustrating a test apparatus according to one embodiment of the present disclosure, FIG. 4 is a view illustrating an operation of the test apparatus according to one embodiment of the present disclosure, FIG. 5 is a front view illustrating an upper test socket assembly in the test apparatus according to one embodiment of the present disclosure, FIG. 6 is a top view illustrating an inelastic insulating sheet according to one embodiment of the present disclosure, FIG. 7 is a bottom view of FIG. 6, and FIG. 8 is a side view illustrating a vacuum picker according to one embodiment of the present disclosure.

As illustrated in the above drawings, a test apparatus 100 according to one embodiment of the present disclosure is an apparatus for testing a package-on-package (POP) type semiconductor package, and tests a lower package 10 using an upper package 40 pre-selected as a defect-free product or simultaneously tests the upper package and the lower package, and this apparatus may electrically mediate a tester 30 generating a test signal and the package-on-package (POP) type semiconductor package.

The test apparatus 100 according to one embodiment of the present disclosure may include a lower test socket 110 mounted on the tester 300 providing a test signal, and connected to a lower terminal 11 of the lower package 10 to electrically connect the lower package 10 to the tester 30; a guide housing 120 installed above the lower test socket 110 to guide the lower package 10; a pusher 130 configured to be able to be moved vertically by receiving a driving force from a driving unit (DP) 90; an upper test socket 140 mounted on the pusher 130, and having an electro-conductive part 144 installed below the upper package 40 to be electrically connected to a lower terminal 41 of the upper package 40; a vacuum picker 150 mounted on a lower portion of the upper test socket 140 to be able to vacuum-adsorb the lower package 10; and an inelastic insulating sheet 160 installed between the upper test socket 140 and the upper package 40, the inelastic insulating sheet having a through hole 164 formed at a position thereof corresponding to the terminal 41 of the upper package 40 and the electro-conductive part 144 of the upper test socket 140, and having a vacuum space part 161 formed in a lower surface thereof corresponding to the upper test socket 140.

An upper test socket assembly TSA includes the pusher 130, the upper package 40 mounted on the pusher 130, the upper test socket 140 coupled to a lower portion of the upper package 40, and the vacuum picker 150 disposed below the upper test socket 140.

Components of the test apparatus 100 according to one embodiment of the present disclosure is described in detail as below. First, the lower test socket 110 is mounted on the tester 30 to electrically connect the tester 30 and the lower package 10.

The lower test socket 110 may include a plurality of first electro-conductive parts 112 and an insulating part 113. The first electro-conductive part 112 has a configuration in which a plurality of electro-conductive particles is arranged in a thickness direction in an elastic insulating material. The plurality of first electro-conductive parts 112 are spaced apart from each other and disposed inside the insulating part 113 so as to correspond to the lower terminal 11 of the lower package 10 to be connected.

One end of the first electro-conductive part 112 comes in contact with a signal electrode (not shown) provided in the tester 30, and the other end of the first electro-conductive part 112 is connected to the lower terminal 11 of the lower package 10.

The first electro-conductive part 112 may include a first electro-conductive bump 112a protruding downward below the insulating part 113. The first electro-conductive bump 112a is pressed against the signal electrode provided in the tester 30 while a device is being tested, thereby enabling more stable contact between the first electro-conductive part and the tester.

As an elastic insulating material constituting the first electro-conductive part 112, a heat-resistant polymer material having a crosslinked structure, for example, silicone rubber, polybutadiene rubber, natural rubber, polyisoprene rubber, styrene-butadiene copolymer rubber, acrylonitrile-butadiene copolymer rubber, styrene-butadiene-diene block copolymer rubber, styrene-isoprene block copolymer rubber, urethane rubber, polyester rubber, epichlorohydrin rubber, ethylene-propylene copolymer rubber, ethylene-propylene-Diene copolymer rubber, soft liquid epoxy rubber, and the like may be employed.

In addition, as the electro-conductive particle constituting the first electro-conductive part 112, the particles having magnetism may be employed so that they can be reacted by a magnetic field. For example, as the electro-conductive particles, particles obtained by plating a surface of core particle, for example, particles of metals exhibiting magnetism, such as iron, nickel, cobalt, etc., or alloy particles thereof, or particles containing these metals, or particles of these metals, with a metal having excellent electrical-conductivity, such as gold, silver, palladium, radium, or the like; particles obtained by plating a surface of core particle, for example, non-magnetic metal particles, inorganic substance particles such as glass beads or the like, and polymer particles, with electro-conductive magnetic substance such as nickel, cobalt, or the like; or particles obtained by plating core particle with electro-conductive magnetic substance and a metal having excellent electrical-conductivity may be employed.

The insulating part 113 electrically isolates the first electro-conductive parts 112 from each other, forms an appearance of the lower test socket 110, and serves to support the first electro-conductive parts 112 when they receive a contact load. The insulating part 113 may be formed of the same elastic insulating material as that of the first electro-conductive part 112.

It will be easily understood that, in addition to an elastic insulating material, the insulating part 113 may be made of an inelastic insulating material or various other insulating materials capable of electrically isolating the first electro-conductive parts 112 from each other.

In addition, the guide housing 120 is installed on the lower test socket 110. The guide housing 120 has a receiving part 121 in which the lower package 10 can be received. The receiving part 121 may be formed to penetrate the guide housing 120 in a vertical direction. The lower package 10 may reach the lower test socket 110 through the receiving part 121 of the guide housing 120. The guide housing 120 is provided with an inclined surface 122 formed on an inner circumference surface thereof. The inclined surface 122 may guide the pusher 130 moved downward toward the lower test socket 110. In other words, when the pusher 130 on which the upper test socket 140 is loaded moves toward the lower test socket 110 in a state in which it is biased to one side, the pusher 130 comes in contact with the inclined surface 122 and may be thus guided along the inclined surface 122. Therefore, the pusher 130 may align the upper package 40 to a correct position on the lower package 10.

The pusher 130 is configured to be approached to or away from the lower test socket 110 by receive a driving force from a driving unit (DP) 90. In addition, the pusher includes a chamber 131 formed therein to be capable of receiving the upper package 40 and a vacuum pressure passage 132 formed therein to transmit a vacuum pressure.

The pusher 130 may be connected to an external vacuum pressure generating device VG through the vacuum pressure passage 132, so the vacuum pressure generated in the vacuum pressure generating device may be transmitted to the vacuum picker 150 through the chamber 131.

The pusher 130 may be moved by the driving unit 90 in a state in which the upper test socket 140 and the upper package 40 are coupled to each other, to connect the upper test socket 140 to the lower package 10 placed on the lower test socket 110 or separate the upper test socket 140 from the lower package 10. In addition, since the pusher 130 is approached to the lower test socket 110 or moved away from the lower test socket 110, the lower package 10 may be loaded onto the lower test socket 110 or unloaded from the lower test socket 110 by using the vacuum picker 150.

The upper test socket 140 is disposed below the pusher 130, and the upper test socket 140 is electrically connected to the upper package 40 placed in the pusher 130.

In the apparatus for testing a package-on-package (POP) type semiconductor package, a so-called golden device, which consists of a defect-free package pre-selected as a good product and can be utilized to test whether the lower package 10 is normally operated, may be used as the upper package 40.

The lower terminal 41 of the upper package 40 (which is a defect-free package) is configured in the form of a solder ball and is connected to an upper terminal 12 of the lower package 10 (which is being tested) via the second electro-conductive part 144 of the upper test socket 140, so it is possible to test whether the lower package 10 is normally operated.

However, when the lower terminal 41 of the upper package 40 comes into contact with the second electro-conductive part 144 of the upper test socket 140 and, as a result, a current flows, heat is generated from a contact portion between these elements by contact resistance, tin (Sn), which is main material of the lower terminal 41 of the upper package, is oxidized by heat generated from the contact portion, and as the test is repeated, the oxidation of the lower terminal 41 of the upper package is further increased, thereby further increasing the contact resistance. Due to the above, there is a problem in that, after repeated tests are performed several tens to hundreds of times, an electrical connection becomes difficult due to high resistance, thereby making it impossible to perform a normal test for the lower package 10.

Therefore, by forming a plating layer of oxidation-preventing metal (for example, gold, palladium, rhodium, cobalt or the like, or an alloyed metal consisting of two or more of the above metals) on a surface of the lower terminal 41 of the upper package, it is possible to prevent an increase in contact resistance between the second electro-conductive part 144 and the lower terminal 41 of the upper package caused by oxidation of the lower terminal 41 of the upper package even after several repeated tests, thereby improving the test reliability for the lower package 10.

In addition, a structure having a two-layered plating layer consisting of a nickel-plating layer formed by plating nickel on a surface of the lower terminal 41 of the upper package and a plating layer of oxidation-preventing metal formed on the nickel-plating layer is also possible. On the other hand, oxidation of the lower terminal 41 of the upper package can be prevented with only oxidation-preventing metal such as gold. However, in a case where gold is used as oxidation-preventing metal, gold has a strong property by which it is absorbed into and alloyed with different metal such as tin, which is main material of the lower terminal 41 of the upper package, so that the contact resistance may be increased after performed a large number of tests. Therefore, if an underlayer such as a nickel-plating layer is provided, since gold is not alloyed with nickel, the defect-free upper package 40 can be used for test of the lower package 10 for a longer period of time.

In addition, if a plating layer of oxidation-preventing metal is formed on the lower terminal 41 of the upper package which is in direct contact with the second electro-conductive part 144 of the upper test socket 140, it is also possible to form a structure having a three-layered or four-layered plating layer in order to enhance adhesive strength and durability between a solder-ball shaped lower terminal 41 of the upper package and the second electro-conductive part 144.

As a method for coating the surface of the lower terminal 41 of the upper package, for example, a brush plating method may be used employed. The brush plating method is a partial plating method using an electroplating technology, but does not use a plating bath using in the conventional wet plating. In this brushing plate method, partial plating can be made by using a dedicated brush tool and a rectifier, so it is possible to easily coat the surface of the solder ball with oxidation-preventing metal.

Meanwhile, the lower terminal 41 of the upper package is repeatedly contacted with the second electro-conductive part 144, so the solder ball shape of the lower terminal may be deformed. Therefore, after removing the solder ball shaped lower terminal 41 of the upper package by a method in which the terminal is melted at a high temperature, etc., a surface of the portion from which the terminal was removed is coated with oxidation-preventing metal, for example gold, palladium, rhodium, cobalt or the like, or an alloyed metal consisting of two or more of the above metals, whereby the coated metal may be used as the terminal of the upper package. The lower terminal of the upper package formed as above is advantageous in that it can be used even in a high temperature environment without deforming the outer shape thereof.

Of course, even in this case, if a portion which comes in direct contact with the second electro-conductive part 144 is coated with oxidation-preventing metal, it is also possible to form this portion to have a multi-layered structure.

The above-described oxidation-preventing structure formed by coating the lower terminal 41 of the upper package which comes in direct contact with the electro-conductive part of the upper test socket with oxidation-preventing metal may be applied to the apparatus for testing the package-on-package (POP) type semiconductor package, which tests whether the lower package 10 is normally operated using the upper package 40 pre-selected as the defect-free product, regardless of its structure. For example, although in this embodiment of the present disclosure, the apparatus in which the vacuum pressure line is formed in the upper test socket assembly is described as one example, the present disclosure may also be applied to a package-on-package (POP) type test apparatus in which no vacuum pressure line is formed in an upper test socket assembly.

The upper test socket 140 includes an insulating pad 141 covering the chamber 131 and the plurality of second electro-conductive parts 144 supported by the insulating pad 141.

The second electro-conductive part 144 may be formed in a configuration in which plurality of electro-conductive particles are included in an elastic insulating material. An elastic insulating material and electro-conductive particles which are the same as those constituting the first electro-conductive part 112 may be used for constituting the second electro-conductive part 144.

The insulating pad 141 electrically isolates the second electro-conductive parts 144 from each other, forms an appearance of the upper test socket 140, and serves to support the second electro-conductive parts 144 when they receive a contact load. The insulating part 141 may be formed of the same elastic insulating material as that of the second electro-conductive part 144.

In addition to an elastic insulating material, the insulating pad 141 may be made of an inelastic insulating material or various other insulating materials capable of electrically isolating the second electro-conductive parts 114 from each other.

The insulating pad 141 formed of an inelastic insulating material is advantageous for pressing the lower package 10 toward the lower test socket 110 when the upper test socket 140 is in contact with the lower package 10, and the insulating pad 141 formed of an inelastic insulating material is more preferable since if it stably pressurizes the lower package 10, the lower terminal 11 of the lower package 10 can be stably connected to the first electro-conductive part 112 of the lower test socket 110.

The insulating pad 141 formed of an inelastic insulating material is not easily elastically deformed like an elastic insulating part of a conventional silicone rubber test socket, but it is preferable that the insulating pad has a bending-deformable property. This property increases resistance to the device under test having various types of warpage deformation, and is advantageous for increasing durability and lifespan. Such the insulating pad 141 made of such inelastic insulating material may be made of polyimide (PI), engineering plastic, or various other inelastic insulating materials.

The insulating pad 141 has an insulating pad hole 142 formed therein. The insulating pad hole 142 is communicated with the chamber 131 to enable a vacuum pressure in the chamber 131 to be transmitted. A vacuum picker inserting recess 148 into which the vacuum picker 150 can be inserted is provided at a lower portion of the insulating pad hole 142 of the insulating pad 141, so a space in which the vacuum picker 150 can is moved may be formed.

The second electro-conductive part 144 is formed to pass through the insulating pad 141 in a thickness direction and is supported by the insulating pad 141.

One end of the second electro-conductive part 144 may be in contact with the lower terminal 41 of the upper package 40, and the other end may be connected to the upper terminal 12 of the lower package 40.

The second electro-conductive part 144 may include a second electro-conductive part body 145 placed in the insulating pad 141, and a second electro-conductive part bump 146 connected so as to the electro-conductive part body 145 to protrude from a surface of the insulating pad 141. The second electro-conductive part bump 146 may be pressed against the upper terminal 12 of the lower package 10 when the upper test socket 140 approaches the lower test socket 110, so it can come in stably contact with the upper terminal 12.

The upper test socket 140 is adhered to the pusher 130 by an adhesive, and it is preferable to prevent the vacuum pressure from being damaged between the upper test socket 140 and the pusher 130 by vacuum-sealing the adhered portion. The upper package 40 may also be configured to be adhered to the chamber 131 by an adhesive.

A variety of adhesive means, such as double-sided tape, liquid instant adhesive, and the like may be used as the adhesive, it is preferable that adhesive strength of the adhesive is sufficiently tolerable even when a vacuum pressure is transmitted to the vacuum picker, and it is generally preferred to use the adhesive having adhesive strength in the range of 300 to 2,000 gf/in.

As described above, by employing the structure in which the components of the upper test socket assembly are combined through an adhesive, separation and combination of the upper package is easily performed, the adhesive absorbs some of impact generated when the upper test socket assembly comes into contact with the lower package, thereby mitigating impact.

In addition, in general, a solder ball type terminal is used as the lower terminal 41 of the upper package 40 or the lower terminal 11 of the lower package 10, but it is apparent to those skilled in the art that a land-type terminal flattened by grinding a solder ball-type terminal may be used.

As illustrated in FIGS. 3 to 5, the inelastic insulating sheet 160 is disposed between the upper test socket 140 and the upper package 20.

As illustrated in FIGS. 6 and 7, the inelastic insulating sheet 160 is formed in a sheet shape having an upper surface corresponding to the upper package 20 and the lower surface corresponding to the upper test socket 140. In the inelastic insulating sheet, a plurality of through-holes 164 are formed in a portion corresponding to the terminals 41 of the upper package 40 and the second electro-conductive part 144 of the upper package 40, and the vacuum space part 161 is formed in the lower surface corresponding to the upper test socket 140. This vacuum space part has an elongated shape in which a concave groove is elongated or a cross shape in which two elongated grooves are intersected. In addition, the vacuum space part 161 may be formed in various forms other than the above shape as long as the vacuum pressure can be transmitted.

As shown by the arrow in FIG. 4, a vacuum pressure line VL is formed by the vacuum pressure (suction pressure or release pressure) generated in the vacuum pressure generating device VG, and the vacuum pressure is transmitted to the vacuum picker 150 through the vacuum pressure passage 132 of the chamber 131, the vacuum space part 161 of the inelastic insulating sheet 160 (see FIG. 7), and the insulating pad hole 142.

The vacuum space part 161 of the inelastic insulating sheet 160 serves as a part of the vacuum pressure line VL of the upper test socket assembly TSA, and may have various shapes capable of forming the vacuum pressure line VL of the upper test socket assembly.

In addition, in the vacuum space part 161, a plurality of deformation-preventing pillars 162 having a height compensating for the concave groove thereof may be formed at a center and a periphery thereof. This deformation-preventing pillar 162 may serve to increase the durability of and prevent a deformation of the inelastic insulating sheet 160. In particular, in the case of the upper package 140 that is not in the form of a full array, when checking whether the package is normally operated, there is a high possibility that deformation occurs in the vacuum space part 161 of the inelastic insulating sheet 160, and it is thus preferable to necessarily form the deformation-preventing pillar 162.

Although the deformation-preventing pillar 162 is exemplarily illustrated as having a rectangular pillar shape in FIG. 7, the deformation-preventing pillar 162 may have any one of various shapes such as a cylindrical pillar, a polygonal pillar, an irregular pillar, and the like.

The above inelastic insulating sheet 160 may be formed from polyimide, FR4, engineering plastic or a metal on which an insulating plating layer is formed.

In addition, the vacuum picker 150 is mounted on a lower portion of the upper test socket 140 to so as to enable it to vacuum-adsorb the lower package 10. In order to enable the vacuum picker 150 to adsorb or pressurize the lower package 10, the vacuum picker inserting recess 148 may be provided in the upper test socket 140 to form a space in which the vacuum picker 150 may be moved can move may be formed, The vacuum picker 150 has the insulating pad hole 142 so as to enable it to receive a vacuum pressure from the chamber 131. The insulating pad hole 142 may be communicated with the chamber 131 and the vacuum pressure passage 132.

At least a portion of the vacuum picker 150 may be inserted into the vacuum picker inserting recess 148 of the insulating pad 141, and may be moved into and out of the vacuum picker inserting recess 148.

In a state where a portion of the vacuum picker 150 is placed in the vacuum picker inserting recess 148 at a reference position or a position slightly retreated therefrom, in order to adsorb the lower package 10 to be tested, which is being in a standby state, the vacuum picker is moved downward slightly from the reference position to adsorb the lower package 10, and when an electrical test for the lower package 10 is being performed, the vacuum picker is moved downward a little further to pressurize the lower package 10.

In order to connect the upper test socket 140 to the lower package 10, when the upper test socket 140 is moved toward the lower package 10 by a pressurizing force of the pusher 130, the vacuum picker 150, which was moved downward, is pushed into the vacuum picker inserting recess 148 by a movement of the upper test socket 140, so the vacuum picker 150 does not interfere with a connection between the upper test socket 140 and the lower package 10.

As illustrated in (a) of FIG. 8, the vacuum picker 150 according to one embodiment of the present disclosure may include a vacuum picker main body 151 having a silicone or rubber-based elastic material and a hard stiction-preventing member 152 attached to the vacuum picker main body 151.

The stiction-preventing member 152 is formed on a portion which comes in direct contact with the semiconductor package, and may be made of a hard stiction-preventing material such as a polyimide film, engineering plastic, synthetic resin or the like.

As shown in (b) of FIG. 8, The stiction-preventing members 152 may be attached to both upper and lower surfaces of the vacuum picker main body 151 having a silicone or rubber-based elastic material.

Also, as shown in (c) of FIG. 8, the vacuum picker 150 may be formed of a material which is the same as that constituting the stiction-preventing members 152, and may be formed to have a concave-convex shaped corrugation 154 around an outer circumference thereof. By forming this corrugation 154, even if the vacuum picker 150 is formed of a rather hard material, the corrugation 154 act as a cushion like a spring so that it can be vertically compressed or expanded, whereby the vacuum picker can more easily adsorb the semiconductor package.

Hereinafter, an operation of the test apparatus 100 for the semiconductor package according to one embodiment of the present disclosure is described as below.

As illustrated in FIGS. 3 and 4, the pusher 130 may be moved by the driving unit (DP) 90 and the vacuum picker 150 may be moved downward to adsorb the lower package 10. At this time, the vacuum picker 150 slightly protrudes to a first position which is slightly lowered from a reference position of a lower surface of the second electro-conductive part 144.

Absorbing the lower package 10 using the vacuum picker 150 is performed through the vacuum pressure line VL formed by the vacuum pressure of the vacuum pressure generating device VG. A vacuum pressure of the vacuum pressure generating device is transmitted to the vacuum picker 150 through the vacuum pressure passage 132 of the chamber 131, the vacuum space part 161 of the inelastic insulating sheet 160, and the insulating pad hole 142 to adsorb the lower package 10.

A vacuum pressure from the vacuum pressure generating device flows into a center portion of the chamber 131 through the vacuum pressure passage 132 and then flows into an outer region of an inner space of the chamber 131. Thereafter, the vacuum pressure flows from the outer region to the center portion of the inner space of the chamber 131 through the inelastic insulating sheet 160 having the vacuum space part 161, and is then applied to the vacuum picker 150 of the upper test socket 140.

In order to enable the vacuum picker 150 mounted on the upper test socket 140 to move upward the lower package 10, an appropriate volume of vacuum-internal space of the chamber 131 is preferably $110^{mm^3}$ or more, and a volume of the vacuum space part 161 of the inelastic insulating sheet 160 is preferably $9.5^{mm^3}$ or more.

Then, the vacuum picker 150 may move the lower package 10 adsorbed thereto above the lower test socket 110. That is, the pusher 130 approaches the lower package 10 which is in a standby position, the vacuum picker 150 is moved downward to adsorb the lower package 10 thereto, and the pusher 130 is moved above the lower test socket 110 to enable the lower package to be positioned over the lower test socket 110. At this time, the lower package 10 is disposed so as to allow the lower terminal 11 thereof to come in contact with the first electro-conductive part 112 of the lower test socket 110.

Thereafter, when the pusher 130 is moved toward the lower test socket 110, the vacuum picker 150 is further moved downward to pressurize the lower package 10. Accordingly, the lower terminal 11 of the lower package 10 and the first electro-conductive part 112 of the lower test socket 110 are connected to each other, and the second electro-conductive part 144 of the upper test socket 140 is connected to the upper terminal 12 of the lower package 10 by a movement of the pusher 130. At this time, since a pressurizing force of the pusher 130 is transmitted to the lower package 10 through the upper test socket 140, the tester 30, the lower test socket 110, the lower package 10, the upper test socket 140 and the upper package 40 are electrically connected to each other.

At this time, a test signal generated from the tester 30 is transmitted to the upper package 40 through the lower test socket 110, the lower package 10 and the upper test socket 140, so an electrical test for the upper package 40 and the lower package 10 can be made.

In addition, if the upper package 40 is configured as a golden device, this upper package is advantageous not only for testing whether the lower package 10 is normally operated, but also for testing whether the lower package is properly matched therewith when the upper and lower packages are stacked in a package-on-package manner.

Also, if the upper package 40 is configured as a golden device, there is an advantage in that it may be immediately known that the lower package 10 is a defective product when a defect is occurred during the test. Of course, it is also possible to simultaneously test the upper package 40 and the lower package 10 by not configuring the upper package 40 as a golden device and making the upper package 40 to be tested.

After the test is completed, the vacuum picker 150 is moved upward, and the lower package 10 adsorbed to the vacuum picker 150 is unloaded from the lower test socket 110 according to a movement of the pusher 130 and can be then conveyed to a loading device (not shown).

As described above, when the semiconductor package is tested, the test signal applied from the tester is applied to the lower test socket, the lower package, the upper test socket, and the upper package. In the test apparatus according to the present disclosure, the second test circuit board, which has been disposed in the conventional upper test socket assembly, is removed, and by installing the inelastic insulating sheet (which has the vacuum space) between the upper test socket and the upper package, the vacuum pressure line is secured in the upper test socket assembly, the vacuum pressure from the vacuum pressure generating device can be smoothly applied to the vacuum picker.

In addition, without using the conventional second test circuit board, it is possible to simultaneously check whether the lower package is in a normal state and whether the lower package is normally operated in a state where the lower package is coupled to the upper package. As a result, a length of the signal path between the upper package and the lower package is greatly reduced, so that signal delay and signal distortion can be prevented in high-speed signal transmission, and a semiconductor package which is operated at a high-speed can be precisely tested. Therefore, the test apparatus according to the present disclosure can efficiently perform the electrical property test for the semiconductor package, thereby significantly reducing the test cost and the test time.

Furthermore, since the test apparatus according to the present disclosure has the configuration in which the components constituting the upper test socket assembly are coupled to each other through an adhesive, it is easy to separate and combine the upper package, there is no loss of vacuum pressure by vacuum-sealing adhering portions, and the adhesive can mitigate impact that occurs when the lower package and the upper test socket assembly come into contact with each other.

Also, there is less risk of leakage of vacuum pressure between the pusher and the vacuum picker for adsorbing the lower package, and due to the configuration in which the vacuum pressure is stably transmitted from the vacuum pressure generating device to the vacuum picker, it is possible to reduce a pickup error when the lower package is picked up.

While the present disclosure has been described with reference to the embodiments illustrated in the figures, the embodiments are merely examples, and it will be understood by those skilled in the art that various changes in form and other embodiments equivalent thereto can be performed. Therefore, the technical scope of the disclosure is defined by the technical idea of the appended claims The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A test apparatus for a semiconductor package, comprising:
    a lower test socket mounted on a tester providing a test signal, and connected to a lower terminal of a lower package to electrically connect the lower package to the tester;
    a pusher configured to be able to be moved vertically by receiving a driving force from a driving unit;
    an upper test socket mounted on the pusher, and having an electro-conductive part installed below the upper package to be electrically connected to a lower terminal of the upper package;
    a vacuum picker mounted on a center of the upper test socket to be able to vacuum-adsorb the lower package; and
    an inelastic insulating sheet installed between the upper test socket and the upper package, the inelastic insulating sheet having a through hole formed at a position thereof corresponding to the terminal of the upper package and the electro-conductive part, and having a vacuum space part formed in a lower surface thereof corresponding to the upper test socket.

2. The test apparatus of claim 1, wherein the vacuum space part of the inelastic insulating sheet has a shape of concaved and elongated groove.

3. The test apparatus of claim 2, wherein the vacuum space part has a plurality of deformation-preventing pillars formed therein and having a height for compensating for the concaved groove.

4. The test apparatus of claim 1, wherein the inelastic insulating sheet is formed from any one of polyimide, FR4, engineering plastic and a metal on which an insulating plating layer is formed.

5. The test apparatus of claim 1, wherein a vacuum pressure provided to the pusher is applied to the vacuum picker through the vacuum space part.

6. The test apparatus of claim 1, wherein the upper test socket is attached to the pusher in a vacuum-sealed manner with an adhesive.

7. The test apparatus of claim 1, wherein the electro-conductive part of the upper test socket is formed by arranging a plurality of electro-conductive particles in a thickness direction in an elastic insulating material.

8. The test apparatus of claim 1, wherein the lower terminal of the upper package or the lower package is either a solder ball type or a land type.

9. A test apparatus for a semiconductor package, comprising:
    a lower test socket mounted on a tester providing a test signal, and connected to a lower terminal of a lower package to electrically connect the lower package to the tester;
    a pusher configured to be able to be moved vertically by receiving a driving force from a driving unit; and
    an upper test socket mounted on the pusher, and having an electro-conductive part installed below the upper package that is a defect-free package, to be electrically connected to a lower terminal of the upper package,
    wherein the lower terminal of the upper package is formed in the form of a solder ball, and a plating layer of oxidation-preventing metal is formed on an upper side of the lower terminal of the upper package which comes in direct contact with the electro-conductive part.

10. The test apparatus of claim 9, wherein a nickel-plating layer is formed between a surface of the lower terminal of the upper package and a plating layer of oxidation-preventing metal.

11. The test apparatus of claim 9, wherein the oxidation-preventing metal is gold, palladium, rhodium, cobalt, or an alloyed metal of two or more thereof.

12. The test apparatus of claim 10, wherein the oxidation-preventing metal is gold, palladium, rhodium, cobalt, or an alloyed metal of two or more thereof.

13. A test apparatus for a semiconductor package, comprising:
- a lower test socket mounted on a tester providing a test signal, and connected to a lower terminal of a lower package;
- a pusher configured to be able to be moved vertically;
- an upper test socket mounted on the pusher, and having an electro-conductive part installed below the upper package to be electrically connected to a lower terminal of the upper package;
- a vacuum picker mounted on a center of the upper test socket; and
- an inelastic insulating sheet installed between the upper test socket and the upper package, the inelastic insulating sheet having a through hole formed at a position thereof corresponding to the terminal of the upper package and the electro-conductive part, and having a vacuum space part formed in a lower surface thereof corresponding to the upper test socket.

14. The test apparatus of claim 13, wherein the vacuum space part of the inelastic insulating sheet has a shape of concaved and elongated groove.

15. The test apparatus of claim 14, wherein the vacuum space part has a plurality of deformation-preventing pillars formed therein and having a height for compensating for the concaved groove.

16. The test apparatus of claim 13, wherein the inelastic insulating sheet is formed from any one of polyimide, FR4, engineering plastic and a metal on which an insulating plating layer is formed.

17. The test apparatus of claim 13, wherein a vacuum pressure provided to the pusher is applied to the vacuum picker through the vacuum space part.

18. The test apparatus of claim 13, wherein the upper test socket is attached to the pusher in a vacuum-sealed manner with an adhesive.

19. The test apparatus of claim 13, wherein the electro-conductive part of the upper test socket is formed by arranging a plurality of electro-conductive particles in a thickness direction in an elastic insulating material.

20. The test apparatus of claim 13, wherein the lower terminal of the upper package or the lower package is either a solder ball type or a land type.

* * * * *